United States Patent [19]

Corbett et al.

[11] Patent Number: 4,992,850

[45] Date of Patent: *Feb. 12, 1991

[54] DIRECTLY BONDED SIMM MODULE

[75] Inventors: Tim J. Corbett; Alan G. Wood, both of Boise, Id.

[73] Assignee: Micron Technology, Inc., Boise, Id.

[*] Notice: The portion of the term of this patent subsequent to Feb. 12, 2008 has been disclaimed.

[21] Appl. No.: 311,728

[22] Filed: Feb. 15, 1989

[51] Int. Cl.⁵ .................... H01L 23/28; H01L 23/16; H01L 39/02; H01L 27/10
[52] U.S. Cl. ........................ 357/72; 357/75; 357/80; 357/45; 361/400; 361/412; 361/421
[58] Field of Search .............. 357/75, 72, 80, 74, 357/70, 40, 41, 45; 361/400, 421, 412

[56] References Cited

U.S. PATENT DOCUMENTS 4,656,605 4/1987 Clayton ........................ 357/72
4,903,113 2/1990 Frankeny et al. ............ 361/400

FOREIGN PATENT DOCUMENTS 0005537 1/1985 Japan ........................ 357/75
0101067 5/1985 Japan ........................ 357/75

Primary Examiner—William Mintel
Assistant Examiner—Roy Potter
Attorney, Agent, or Firm—Stanley N. Protigal; Angus C. Fox, III

[57] ABSTRACT

A leadframe interconnect package is tape automated bond (TAB) bonded to circuitry on the chip and which provides a circuit connection for subsequent connection to a printed circuit board. The encapsulated chips will replace both the leadframe and printed circuit board (electrical only) as we now know it in the conventional SIMM module.

13 Claims, 7 Drawing Sheets (PRIOR ART)

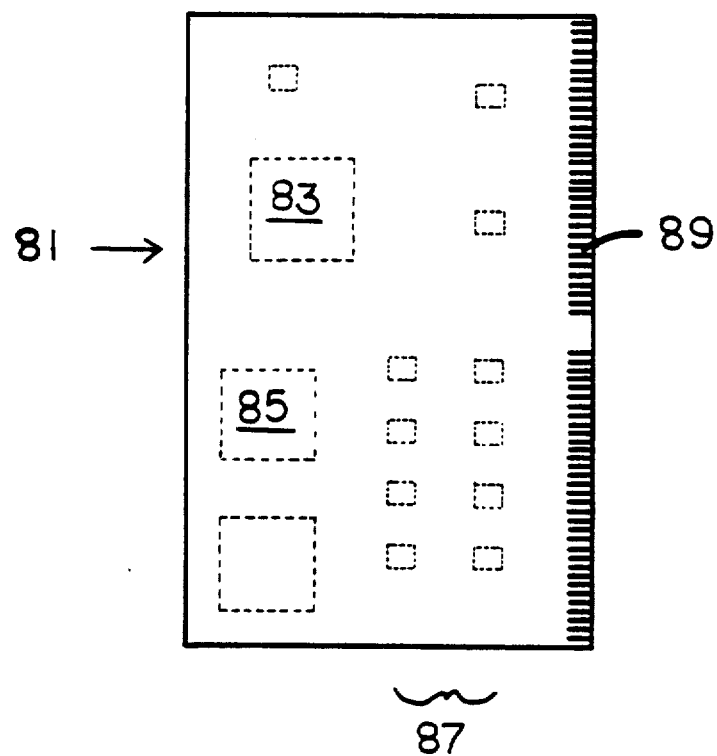

DIRECTLY BONDED SIMM MODULE

FIELD OF THE INVENTION

This invention relates to printed conductor techniques and to semiconductor die interconnect and packaging techniques. The invention specifically relates to connection of multiple semiconductor die onto a polyimide substrate, usually for connection to a edge connector system. The invention has particular utility when used with single in line memory modules (SIMMs) and similar boards using arrays of similar semiconductor dice.

BACKGROUND OF THE INVENTION

Integrated semiconductor devices are typically constructed en masse on a wafer of silicon or gallium arsenide. Each device generally takes the form of an integrated circuit (IC) die, which is attached to a leadframe with gold wires. The die and leadframe are then encapsulated in a plastic or ceramic package, which is then recognizable as an IC (integrated circuit). ICs come in a variety of forms such as dynamic random access memory (DRAM) ICs, static random access memory (SRAM) ICs, read only memory (ROM) ICs, gate arrays, and so forth. The ICs are interconnected in myriad combinations on printed circuit boards by a number of techniques, such as socketing and soldering.

Interconnections among ICs arrayed on printed circuit boards are typically made by conductive traces formed by photolithography and etching processes.

Such semiconductor devices typically take the form of a semiconductor die. The die is generally electrically attached to a leadframe within a package. The leadframe physically supports the die and provides electrical connections between the die and the outside world. As shown in FIG. 1, the die 11 is generally electrically attached to the leadframe by means of fine gold wires 15. These fine gold wires 15 function to connect the die to the leadframe, so that the gold wires 15 are electrically in series with the leadframe leads. The leadframe and die is then encapsulated, in the form of the familiar integrated circuit. The packaged chip is then able to be installed on a circuit board by any number of techniques, such as socketing and soldering. While a ceramic style package is shown in FIG. 1 for clarity, most chips are encapsulated in plastic packages.

One circuit-board-mounted semiconductor chip array that is of particular interest is the SIMM (single in line memory module). SIMM boards are typically constructed with such capacitors, which are usually located beneath or adjacent memory array circuit chips on the SIMM.

SIMM (single in line memory module) boards are circuit arrays which consist of byte multiples of memory chips arranged on a printed circuit board or comparable mounting arrangement. The SIMM board is connected to a circuit control board by an edge connector. FIG. 2 shows a cross section of a typical SIMM board.

The SIMM is a highly space-efficient memory board having no on-board address circuitry and which is designed to plug directly into the address, data and power-supply busses of a computer so that the randomly-addressable memory cells of the SIMM can be addressed directly by the computer's CPU rather than by a bank-switching technique commonly used in larger memory expansion boards. Memory cells on the SIMM are perceived by the computer's CPU as being no different than memory cells found on the computer's mother board. Since SIMMs are typically populated with byte multiples of DRAMs, for any eight bit byte or sixteen bit byte or word of information stored within a SIMM, each of the component bits will be found on a separate chip and will be individually addressable by column and row. One edge of a SIMM module is a card-edge connector, which plugs into a socket on the computer which is directly connected to the computer busses required for powering and addressing the memory on the SIMM.

Single in-line packages (SIPs) are similar in design to SIMMs, except that instead of having a card edge-type connector, SIPs have pins which are either socket mounted or solder mounted to a mother board or bus.

These modules have been constructed by first packaging individual dice (IC chips) into packages, and then soldering the packaged chips onto a printed circuit board. The chips had been attached by surface mount techniques (e.g. PLCC chips) or into through holes (e.g. DIP packaged chips). While this facilitates discrete testing prior to module assembly, no advantage is taken of the module (SIMM) level assembly in connecting the dice to their leadframes.

Other circuits which are constructed from standard components have in the past used discretely encapsulated integrated circuits (ICs) which are then fixed to a printed circuit board. Large scale integrated (LSI) circuits had been used to reduce or eliminate multiplicity of encapsulation operations, but LSI techniques require that each mask step required for each part of the circuit be performed on a wafer used to form the entire circuit.

On circuits with low yields, it is often desirable to fabricate the circuit in segments, and then assemble the completed segments at a board level. Thus, DRAMs are fabricated in excess of 100 dice per wafer, and the dice are separated, even though the computer may have a high number of DRAMs installed as RAM memory. This is done because individual chips will vary in performance across a wafer and because yield tends to diminish as attempts are made to expand memory size. By individually packaging chips and then assembling arrays of chips at a board level, parts may be segregated according to performance and the use of failed parts may be avoided.

When increasing the circuitry on a single integrated circuit, care must be taken to ascertain that the processes which are used to fabricate each circuit element are compatible. Even in cases where, for example, state of the art DRAM technology is used in design of logic chips, the optimum process parameters for different types of circuits will vary. As an example, it is difficult to provide a single chip with both a microprocessor and a memory array.

Thus, a VLSI chip has the advantage of packaging a large number of circuits onto a single leadframe, but requires that a variety of circuits share the same process steps. It would be desirable to provide multiple circuits which are grouped after fabrication into a single integrated circuit package. It would also be desirable to provide circuits which are manufactured under different process steps as a single integrated circuit package.

SUMMARY OF THE INVENTION

According to the invention, integrated circuits (ICs) are tab automated bonded (TAB) to a leadframe interconnect package which provides a functional circuit connection for subsequent connection to a printed circuit board (PCB).

Burn-in is performed by using a reusable burn-in/test fixture designed for discrete dice. The fixture consists of two halves, one of which is a die cavity plate for receiving semiconductor dice as the units under test (UUT); and the other half establishes electrical contact with the dice and with a burn-in oven.

The first half of the test fixture contains cavities in which die are inserted circuit side up. The die will rest on a floating platform. A support mechanism will compensate for variations of overall die thickness. The second half includes a rigid high temperature rated substrate, on which are mounted electrical terminals for each corresponding die pad. Each terminal is connected to an electrical trace on the substrate (similar to a P.C. board) so that each die pad of each die is electrically isolated from one another for high speed functional testing purposes.

The use of a discrete die burn in test fixture permits the use of a number of different devices which have high aggregate manufacturing defect rates to be combined in a combined circuit with a relatively high yield. The test fixture permits failed parts to be eliminated to an extent that the combined circuit is produced with a high yield and is highly reliable. A test fixture which is capable of testing discrete die prior to assembly is described in our U.S. Patent Application 252,606, filed 30 Sept. 88, also assigned to the assignee of the present invention.

After testing, TAB interconnects of the die to a flexible circuit will be used, which will serve as both the "leadframe" to connect the dice to circuitry and as the circuit. Each die will be bonded directly into the final upper and/or lower circuit which is electrically equivalent to a conventional circuit board including the edge finger contacts.

Polymer/Cu circuits are fabricated to a TAB configuration. The polymer/Cu "circuitry" will replace both the leadframe and printed circuit board (electrical only) as we now know it in the conventional SIMM module. Layer-to-layer circuit interconnections are formed by way of Cu to Cu bonds. The interconnects can be done via resistance welding, diffusion bonding, thermal compression, or thermal sonic bonding.

Interconnects consist of unsupported sections of Cu traces on a plurality of planes. The circuits on each plane are positioned so that the appropriate Cu traces are aligned over and under each other. The unsupported traces will meet each other between the upper and lower planes. All Cu to Cu interconnects can be formed simultaneously. The spacing between the circuit planes will be optimized for thermal, mechanical, and electrical properties. It is anticipated that the smaller geometries common with TAB circuitry will provide a significant improvement in electrical properties so that the conventional power and ground plane layers can be eliminated.

The polymer/Cu circuit now "loaded" with ICs is electrically functional and ready for functional testing, but still lacks physical package support.

It is possible to functionally test the polymer/Cu circuit while it is still in a temporary frame apparatus. Testing at this point will be preformed on the circuit in its final form. The temporary frame will also be utilized during assembly operations prior to encapsulation to physically support the circuit and provide protection against handling damage. The parts could also be tested after TAB but before encapsulation, and reworking of the TABed die could be performed if defective dice are found.

After the TAB step, the Cu to Cu interconnections and the electrical functional tests are complete. The unit is then ready for encapsulation. The temporary frame apparatus will support the TAB circuitry as it is placed in the mold. Resin is injected into the mold encapsulating the dice and circuitry creating a single common package for the entire SIMM circuit.

Of course, other metals can be used for the interconnections besides Cu to Cu. For example, while difficult to work with, aluminum may prove to be a good bonding material for certain applications. Likewise, gold or various combinations of metals may prove to be useful for the interconnections.

In one embodiment, upper and lower circuits are positioned so that the edge contact fingers are back to back thus resembling the edge contacts as they would appear on the conventional PC board. The mold is designed so that the edge contacts are exposed for electrical contact. Resin will fill and support only the under side of the edge fingers creating a sandwich arrangement, consisting of edge contact, resin and edge contact.

In alternate embodiments, a TAB circuit with ICs mounted to the TAB circuit is encapsulated on one or both sides, with external terminations exposed for subsequent connections.

The techniques used for assembling arrays of similar circuits are also applicable for forming circuit modules of unlike circuits. In such an arrangement, the individual dice are mounted to the TAB printed wire assembly (PWA) and the dice are encapsulated subsequent to the dice being mounted. While this technique can be used for most board level products, it is particularly suitable for products in which it would be uneconomical to replace components on the board instead of replacing the entire board. External connections are provided either as a part of the encapsulated TAB PWA, or by attaching an appropriate connector to the PWA.

This enables an encapsulated assembly to be formed in circumstances where an LSI circuit would be ideal for assembly purposes, but the yields of manufacturing LSI circuits would result in undue expense.

BRIEF DESCRIPTION OF THE DRAWINGS

FIG. 8 shows a configuration of a circuit which includes different types of chips to form a large scale circuit device.

DETAILED DESCRIPTION OF THE PREFERRED EMBODIMENT

Figure 1:
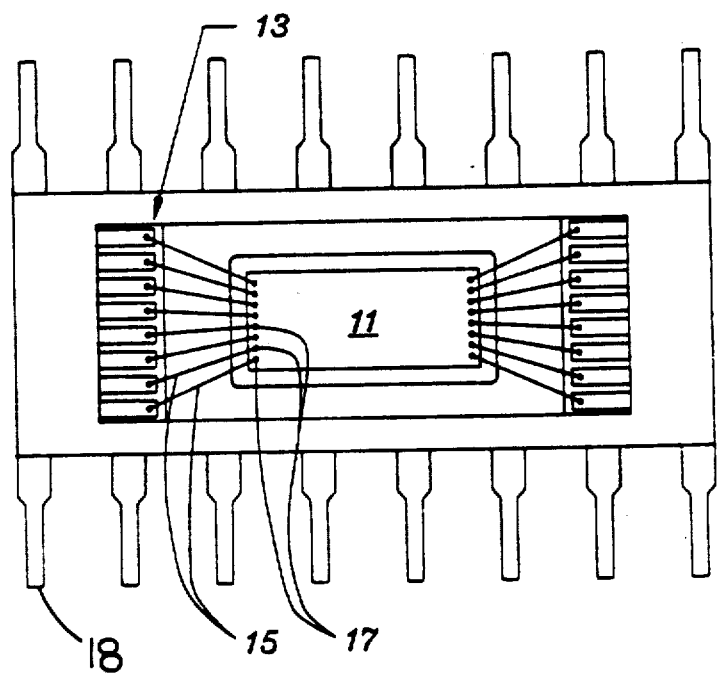
FIG. 1 (prior art) shows a top view of a semiconductor device electrically attached by wires to a leadframe.
Figure 2:
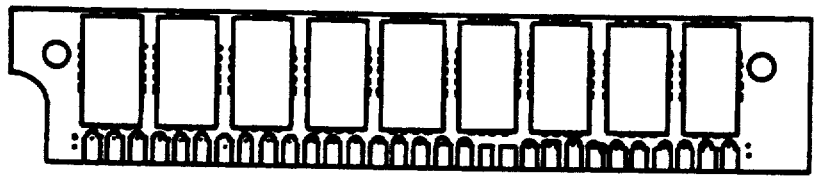
FIG. 2 (prior art) shows a conventional SIMM board, using discrete memory chips.
Figure 3:
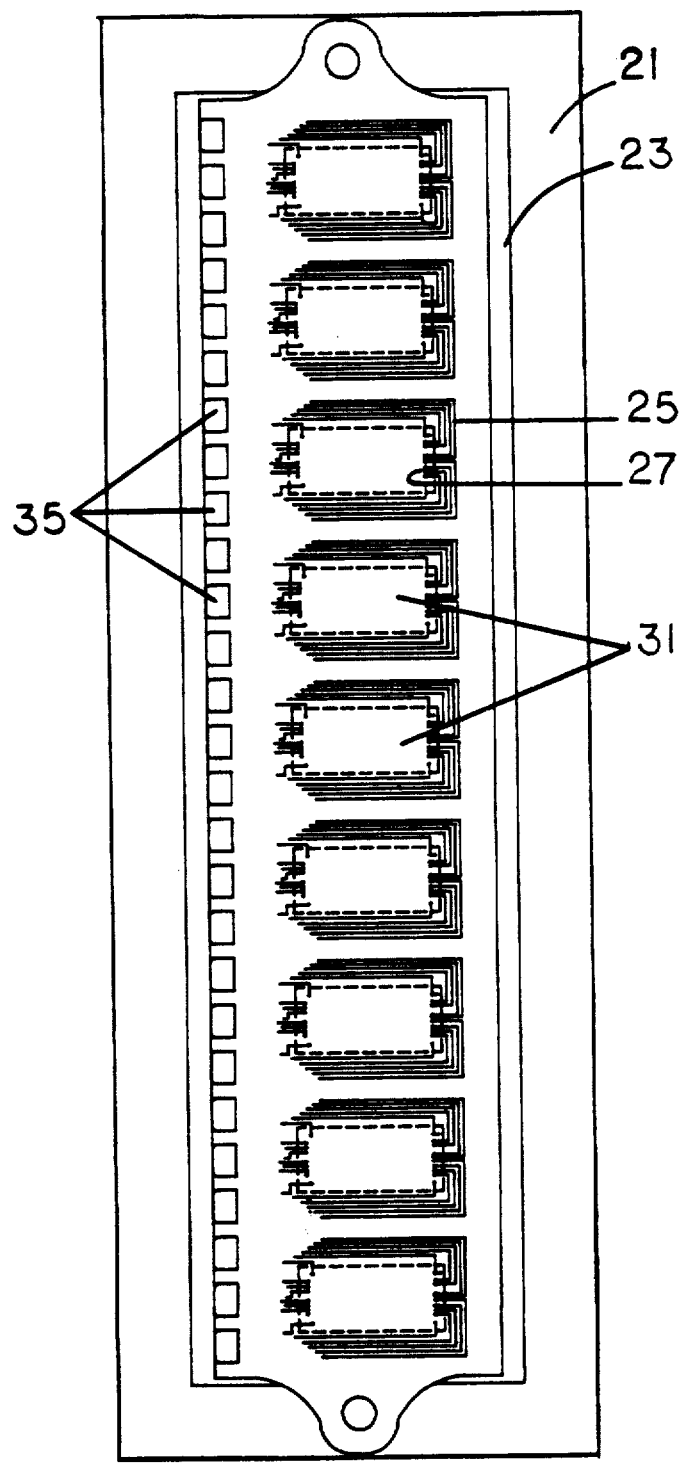
FIG. 3 shows a TAB interconnection sheet, formed according to the invention, mounted in a temporary carrier.
Figure 4:
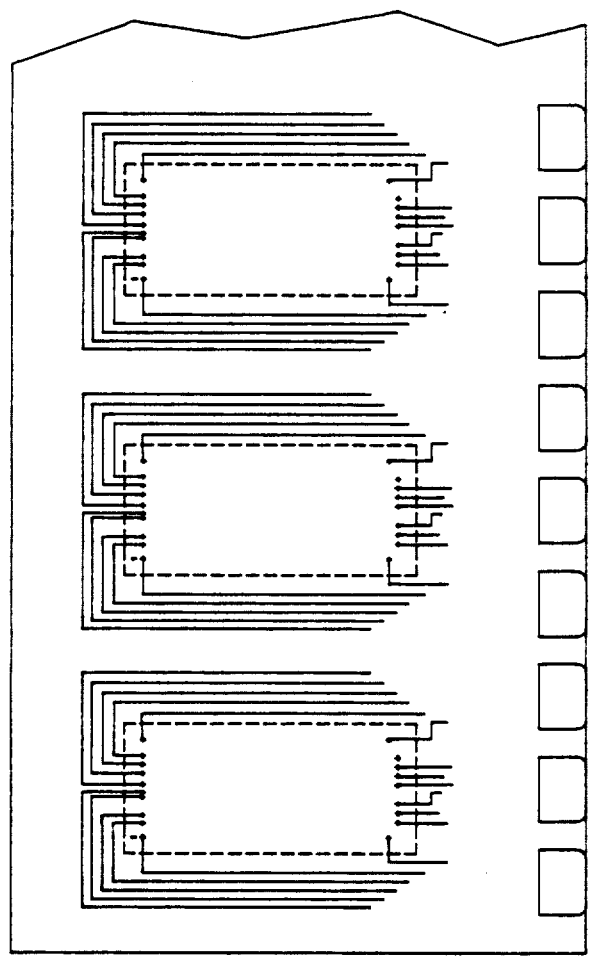
FIG. 4 shows a configuration of a circuit module constructed in accordance with a preferred embodiment of the invention.

FIG. 3 shows a temporary carrier 21 supporting a TAB connection sheet 23. The TAB connection sheet 23 is a flexible dielectric sheet, with circuit traces 25 printed thereon, preferably consisting of Kovar/Cu circuits fabricated to a TAB configuration. The circuit traces include contact fingers 27, which conform to contact bumps (corresponding to contact pads 17, shown in FIG. 1). The contact bumps are located on semiconductor dice 31, which are placed onto the TAB connection sheet 23.

The TAB connection sheet 23 further includes circuitry which connects the contact fingers 27 to edge connector terminal contacts 35, The contact fingers 27 are a part of this circuitry. Therefore, the TAB connection sheet 23 performs the following functions:
 (a) connects the dice to external circuitry;
 (b) die 31 attaches the dice (tab-and-bump) in that connection;
 (c) interconnects the dice in the SIMM format;
 (d) forms the edge connector terminals.

The dice 31 are placed on the TAB connection sheet 23 so that the contact fingers 27 make the appropriate connections (with the bumps) on the dice 31. The dice 31 are bonded to the contact fingers 27 by conventional TAB techniques. Pressure bonding is one technique used to bond the contact fingers 27. Other techniques can be used, such as ultrasonic bonding and thermal bonding (thermal sonic bonding), usually in combination with pressure. The bonding of the dice 31 to the contact fingers 27 on the TAB connection sheet 23 secures the dice 31 to the TAB connection sheet 23 during subsequent processing. This bonding step should also serve as the final bond after the dice 31 are permanently housed. This bonding step would be the only die bonding step in this entire process unless a (defective) die is replaced.

Figure 6:
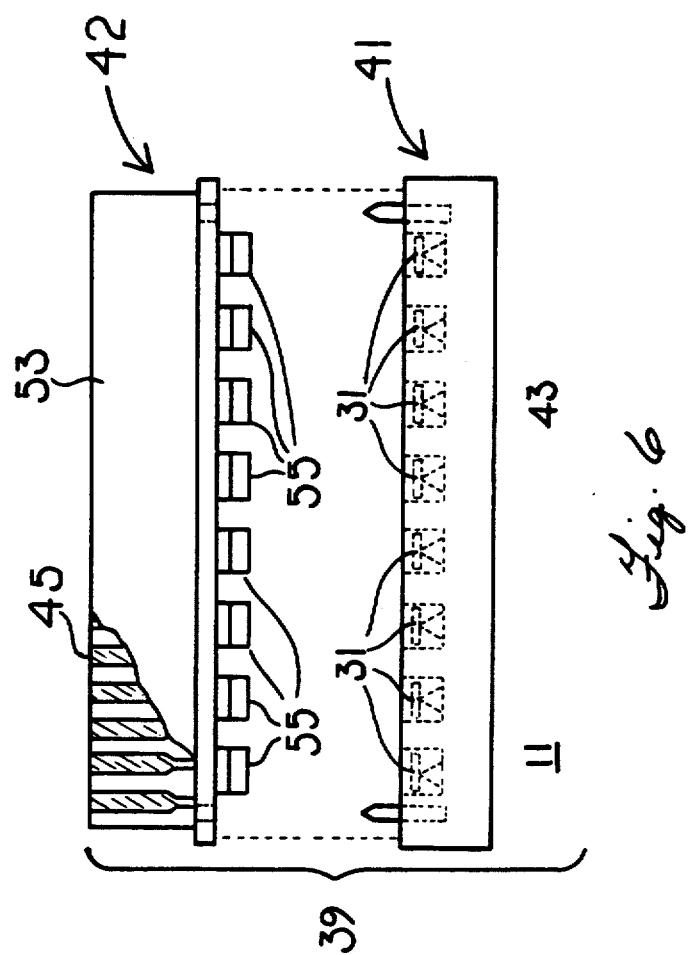
FIG. 6 shows a test fixture used with the invention.
Figure 7:
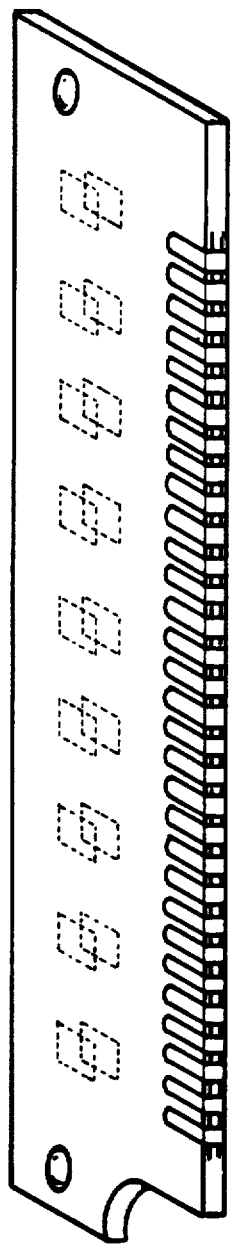
FIG. 7 shows a configuration of a double sided format circuit module constructed in accordance with the invention.

Prior to the dice 31 being placed on the TAB connection sheet 23, burn-in may be performed by using a burn-in/test fixture 39 designed for discrete dice, as shown in FIG. 6. The fixture 39 consists of two halves 41, 42, one of which 41 is a die cavity plate for receiving semiconductor dice 31 as the units under test (UUT); and the other half 42 establishes electrical contact with the dice 31 and with a burn-in oven.

The first half 41 of the test fixture 39 contains cavities in which dice 31 are inserted circuit side up. The dice 31 will rest on a floating platform. A support mechanism under the die platform will provide a constant uniform pressure or force to maintain adequate electrical contact to the die contacts on the UUT to terminal tips on the second half 42. The support mechanism will compensate for variations of overall die 31 thickness.

The second half 42 includes a rigid high temperature rated substrate 53, on which are mounted electrical terminals 55 for each corresponding die 31. The terminals 55 may be probe wires, contact pads or other appropriate terminations. Each terminal 55 is connected to an electrical trace on the substrate (similar to a P.C. board) so that each die pad of each die 31 is electrically isolated from one another for high speed functional testing purposes. The terminals 55 are arranged in an array to accommodate eight or sixteen dice. An edge connector 57 is used to connect the test fixture 39 to external testing apparatus (not shown).

After testing, the dice 31 are attached to the TAB connection sheet 23, which is a polymer/Cu circuit. The TAB connection sheet 23 will serve as both the "leadframe" to connect the dice to circuitry and as the SIMM circuit. Although the TAB connection sheet 23 will replace both the leadframe and printed circuit board (electrical only) as we now know it in a conventional PWA, it does not provide rigid support, if that is necessary.

If required, upper to lower circuit interconnections on the TAB connection sheet 23 are formed by way of Cu to Cu bonds. The interconnects can be done via resistance welding, diffusion bonding, thermal compression, or thermal sonic bonding.

Interconnects consist of unsupported sections of Cu traces on both the upper and lower planes. The two circuits are positioned so that the appropriate Cu traces are aligned over and under each other. The unsupported traces will meet each other halfway between the upper and lower planes where upper and lower electrodes will form the Cu to Cu bonds. All Cu to Cu interconnects can be formed simultaneously. The spacing between the two circuit planes will be optimized for thermal, mechanical, and electrical properties. It is anticipated that the smaller geometries common with TAB circuitry will provide a significant improvement in electrical properties so that the conventional power and ground planes can be eliminated.

The TAB connection sheet 23 is preferably a polyimide/Cu circuit. The "circuitry" that the die 31 are bonded into would not be the conventional leadframe but rather would be bonded directly into the upper and/or lower conductor plane of TAB connection sheet 23. This circuit is electrically equivalent to a conventional SIMM circuit including the edge finger contacts. The SIMM circuits would be purchased pre-fabricated, ready for gang bonding using TAB techniques.

In the preferred embodiment, the TAB connection sheet 23 is a multilayer flexible circuit board and therefore further interconnects are not necessary unless jumper connections are desired. In the preferred embodiment, a four layer flexible circuit board is anticipated, although the precise number of layers will depend on specific circuit design.

The TAB circuit 23a now "loaded" with ICs is electrically functional and ready for functional testing, but still lacks physical package support.

It is possible to test the TAB circuit 23a in a temporary frame apparatus. Testing at this point will be performed on the circuit in its final form except for encapsulation, so that not testing the circuit in the temporary frame will affect only product yield and not reliability. The temporary frame will also be utilized during interconnect and encapsulation to physically support the circuit and provide protection against handling damage.

Moreover, since the dice may be tested in the configuration of a final circuit, greater performance ratings and quality control can be established.

The parts could also be tested, after TAB but before encapsulation, but the would require reworking a TABed die 31. In the present embodiment, it is anticipated that the TAB yields will be high enough to make it more economically feasible to encapsulate the TAB circuit 23a prior to final testing, thereby committing the TAB assembly to its final form at this point. On the other hand, if the particular circuit results in a significantly low yield after TAB, the parts will be tested prior to encapsulation. The failed parts will then be replaced, or the good parts will be removed from the TAB sheet and placed on a fresh TAB sheet.

Figure 5:
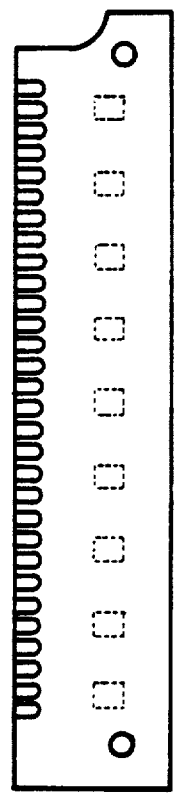
FIG. 5 shows a configuration of a single sided format circuit module constructed in accordance with the invention.

After the TAB step, the Cu to Cu interconnections and the electrical functional tests are complete. The unit is then ready for encapsulation. The temporary carrier 21 will support the TAB connection sheet 23 as it is placed in a mold. Resin is injected into the mold encapsulating the dice 31 and circuitry creating a single common package for the entire SIMM circuit as shown in FIG. 5. The upper and lower circuits are positioned so that the edge connector contact terminals 35 are back to back thus resembling the edge terminals as they would appear on the conventional PC board. The mold is designed so that the edge contacts are exposed for electrical contact. Resin will fill and support only the under side of the edge fingers creating a sandwich arrangement, consisting of edge contact, resin and edge contact.

Indentations in the exterior of the molded package will allow capacitors to be mounted via IR reflow or other laser technology as required.

If for any reason a die 31 becomes defective after being committed to the circuit, optional provisions can be made to replace the defective die 31. Each die 31 will have a portion of unsupported traces at the perimeter of the die 31. The defective die 31 can be removed by shearing, cutting, or laser removal of the unsupported traces close to the die 31. A replacement die 31 already TAB mounted to a circuit compatible with the existing circuit so that there is an appropriate overlap of the I/0 traces. The replacement die 31 can be joined electrically to the circuit using the same interconnect methodology. The replacement module would be attached to the original TAB circuit 23a by Cu to Cu diffusion bonding or by other appropriate techniques, which preferably are diffusion bonding techniques.

The TAB geometries should allow plenty of room thus providing opportunity to densify the module. An extra die can be used for replacing die via redundancy/-fuse techniques.

Burn-in is used to increase yield and reliability in this process. The reusable test modules will house the bumped die 31 and provide the necessary physical support for the pressure contacts. The test modules will contain die 31 each with their own electrical I/O's and will be electrically and physically compatible through burn-in and the post burn-in functional, speed, and performance testing. These test vehicles can be designed so that the functional testers can test them in ×8 or ×16 configurations thus allowing the testers to run at their optimum efficiency. After functional testing, the die 31 are removed from the temporary test modules and are ready for the following steps.

One of the benefits of TAB technology is the reduced real estate required to perform the same function as conventional flexible circuit board technology. Perhaps the idea of redundancy on a whole die level could be entertained here. In the event a die 31 becomes defective, the extra on-board die 31 could replace the defective component as detected at test. The TAB scaling should allow plenty of room for an additional die 31 and yet maintain the conventional SIMM dimensional profiles.

After the gang die bonds, the Cu to Cu interconnections are formed, and the electrical functional tests are complete, the assembly is now ready for encapsulation. A frame will support the TAB circuitry as it is placed in the mold. Resin is injected into the mold encapsulating the die 31 and circuitry thus providing the needed physical support.

The inventive configuration eliminates the need for individual die packages, leadframe, and flexible circuit board. The mold is designed so that the edge contact fingers on the two back to back layers are positioned on the surface of the mold. The resin will fill and support only the underside of the edge fingers creating a "edge contact"-"resin"-"edge contact" sandwich thus resembling the edge connector of a conventional flexible circuit board.

Indentations in the exterior of the molded package will allow capacitors to be mounted via IR reflow, if needed.

Referring to FIG. 8, the inventive techniques can be applied to circuits which use different types of dice. In the example shown, an encapsulated flexible circuit board assembly 81 has mounted to it a microprocessor 83, along with a PROM 85 and a bank of DRAMs 87. This may form the circuitry of a small computer. The circuit shown has an edge connector 89, which permits insertion into a connector slot (not shown) of a control board or of a motherboard of a different computer.

This technique permits separate dice to be assembled into a single basic package (package 81). While the package 81 is similar to a very large scale integrated circuit (VLSI), the component parts are discrete circuit chips, which are internal to the package. Since the wire connections are predetermined, the costs of separately encapsulating the chips, followed by mounting the encapsulated chips as separate ICs, are avoided.

The encapsulated parts are therefore in a form which is provided as a single component. The parts are called board level integrated circuits, since multiple dice are integrated onto a single flexible circuit board.

The different devices on the package are able to be tested prior to encapsulation, so that varying wafer yields in manufacturing the individual component dice does not result in a corresponding cumulative failure rate in manufacturing the package 81. The testing prior to assembly further permits parts, such as parts 85 and 87, to be performance matched, thereby providing greater overall performance and reliability. This permits the utilization of parts whose parameters would be otherwise unacceptable from a quality standpoint as generic use parts, while at the same time holding more conservative margins in reliability for the specific application.

What has been described are very specific configurations of circuit arrangements and a test fixture. Clearly, modification to the existing apparatus can be made within the scope of the invention. It is possible to construct the invention in a variety of configurations, such as a single incline package (SIP) board. It is possible to configure the invention as a number of devices other than a computer board with built-in memory. Accordingly, the invention should be read only as limited by the claims.

We claim:

1. A memory array in which a plurality of memory circuit devices are arranged in a manner such that memory information is obtained by addressing bits of information from a selected number of the memory devices in the array in a format, and the format of bits forms a byte of memory data such that each byte includes bits from each memory device in the selected number of the circuit devices, and wherein the bits are addressed as rows and columns of information in a matrix on each memory device, characterized by:

(a) a support structure which includes a single polymeric sheet, the polymeric sheet having a plurality of die receiving portions thereon, having tape automated bond (TAB) leads thereon and having a first set of electrical circuit traces on one side of the polymeric sheet, the tape automated bond pads being in electrical communication with the circuit traces;

(b) a plurality of integrated circuitry memory devices, each device consisting of circuit elements deposited on a substrate and having conductive bumps deposited thereon, the integrated circuit devices being located within separate ones of the receiving portions of the single polymeric sheet, and connected to the polymeric sheet by being attached to the tape automated bond pads at the conductive bumps, and each of the integrated circuit devices being connected to the TAB leads on the polymeric sheet within its respective die receiving portion;

(c) a second set of circuit traces on a plane which is separate from said one side of the polymeric sheet, the second set of circuit traces being in electrical communication with the first set of electrical circuit traces;

(d) circuit terminals in electrical communication with the circuit traces, the circuit terminals configured in a pattern which conforms to a predetermined external circuit connection and memory address protocol; and (e) means to mechanically stabilize the memory array so that the polymeric sheet, the memory devices and the circuit terminals are maintained in electrical communication during normal service.

2. A memory array as defined in claim 1, further characterized by:
the means to mechanically stabilize the memory array including mechanical structure which supports the circuit terminals.

3. A memory array as defined in claim 2, further characterized by:
the means to mechanically stabilize the memory array including plastic encapsulation of the polymeric sheet and the memory devices.

4. A memory array as defined in claim 2, further characterized by:
the means to mechanically stabilize the memory array including plastic encapsulation of the polymeric sheet and the memory devices, wherein the circuit terminals remain at least partially exposed through the encapsulation.

5. A memory array as defined in claim 2, further characterized by:
the circuit terminals conforming to a SIP pin configuration.

6. A memory array as described in claim 1, characterized by:
the terminals being configured as a SIMM edge connector, wherein the edge connector is insertable into a data bus slot for SIMM configuration memory modules.

7. A memory array as described in claim 1, characterized by:

(a) the second set of circuit traces having tape automated bond (TAB) pads thereon, the tape automated bond pads being in electrical communication with the circuit traces on the polymeric sheet;

(b) a second plurality of integrated circuit memory devices, each device consisting of circuit elements deposited on a substrate and having conductive bumps deposited thereon, the integrated circuit devices being attached to the tape automated bond pads on the second set of circuit traces at the conductive bumps; and (c) said means to mechanically stabilize the memory array further supporting the second plurality of integrated circuit memory devices.

8. A memory array as described in claim 1, characterized by:

(a) each memory device having addresses which are arranged in similar matrices of rows and columns on the memory device; and (b) the addressing of a row of memory devices being accomplished to corresponding rows and columns on each memory device in a row of memory devices in response to address commands.

9. A memory array as described in claim 1, further characterized by:
one of said memory devices in each row providing parity information such that a column of the memory devices provides said parity information.

10. A memory array as described in claim 1, further characterized by:

(a) the memory devices being random access memory semiconductor devices, having read and write address bits thereon;

(b) the devices having row and column enable bits for the memory devices.

11. A memory array as described in claim 1, further characterized by:
the memory devices being dynamic random access memories.

12. A memory array as described in claim 1, further characterized by:

(a) an address circuit responding to address signals received from a computer and addressing the memory devices in a sequence which permits said selective enablement; and (b) said address circuit being a programmable array logic circuit, the programmable array logic device controlling the enablement of memory devices in said memory array.

13. A memory array as described in claim 1, further characterized by:

(a) each memory device having addresses which are arranged in similar matrices of rows and columns on the memory device;

(b) the addressing of a row of memory devices being accomplished to corresponding rows and columns on each memory device in a row of memory devices in response to address commands;

(c) an address circuit responding to address signals received from a computer and addressing the memory devices in a sequence which permits said selective enablement;

(d) a driver for providing address signals to said address circuit, in response to signals received from the computer; and (e) termination capacitors used to compensate for a shifted impedance load of the memory devices caused by the multiple rows of said memory devices, when provided with computer address signals at signal levels intended for a single row of memory devices.

* * * * *